(12) United States Patent
Toshima et al.

(10) Patent No.: US 10,001,702 B2
(45) Date of Patent: Jun. 19, 2018

(54) IMPRINTING APPARATUS, DEVICE FABRICATION METHOD, AND IMPRINTING METHOD

(71) Applicant: CANON KABUSHIKI KAISHA, Tokyo (JP)

(72) Inventors: Takashi Toshima, Utsunomiya (JP); Tomokazu Taki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 607 days.

(21) Appl. No.: 14/276,829

(22) Filed: May 13, 2014

(65) Prior Publication Data

US 2014/0339721 A1  Nov. 20, 2014

(30) Foreign Application Priority Data

May 16, 2013 (JP) .................................. 2013-104298
Apr. 17, 2014 (JP) .................................. 2014-085929

(51) Int. Cl.
   *G03F 7/00* (2006.01)
(52) U.S. Cl.
   CPC .................................. *G03F 7/0002* (2013.01)
(58) Field of Classification Search
   CPC .................................................... G03F 7/0002
   See application file for complete search history.

(56) References Cited

U.S. PATENT DOCUMENTS

| | | | |
|---|---|---|---|
| 6,921,615 B2 | 7/2005 | Sreenivasan | |
| 7,815,425 B2 | 10/2010 | Tokita | |
| 7,846,266 B1 | 12/2010 | Dibiase | |
| 9,128,371 B2 | 9/2015 | Kurosawa | |
| 9,442,370 B2 | 9/2016 | Schiffman | |
| 2007/0085987 A1 | 4/2007 | Ottens | |
| 2007/0138414 A1 | 6/2007 | Stevens | |
| 2007/0140910 A1 | 6/2007 | Banine | |
| 2007/0176320 A1 | 8/2007 | Nakamura | |
| 2007/0263200 A1 | 11/2007 | Petrus Compen | |
| 2008/0191372 A1 | 8/2008 | Takaoka | |

(Continued)

FOREIGN PATENT DOCUMENTS

| | | |
|---|---|---|
| CN | 1952777 A | 4/2007 |
| CN | 102004393 A | 4/2011 |

(Continued)

*Primary Examiner* — Larry Thrower
(74) *Attorney, Agent, or Firm* — Canon U.S.A., Inc. IP Division

(57) ABSTRACT

An imprinting apparatus that imprints a pattern on a resin on a substrate using a mold, includes a detector configured to detect a mold mark and a substrate mark, a driving unit configured to change relative positions of the mold and substrate, a curing unit configured to cure the resin, and a controller configured to control the detector, the driving unit, and the curing unit. The controller performs an alignment step of controlling the driving unit in accordance with the detected mold and substrate marks to perform alignment, a curing step of causing the curing unit to cure the resin in contact with the mold after the alignment step, and a detection step of causing the detector to detect the mold and substrate marks after the curing step to determine an amount of relative misalignment between the mold and the substrate after the resin has been cured.

11 Claims, 9 Drawing Sheets

(56) References Cited

U.S. PATENT DOCUMENTS

| | | |
|---|---|---|
| 2009/0267267 A1 | 10/2009 | Yoneda |
| 2010/0072647 A1 | 3/2010 | Tokue |
| 2010/0072664 A1 | 3/2010 | Kawakami |
| 2010/0097587 A1 | 4/2010 | Petrus De Jong |
| 2011/0198769 A1 | 8/2011 | Maeda |
| 2011/0273687 A1 | 11/2011 | Leenders |
| 2012/0196389 A1 | 8/2012 | Matsuoka |
| 2012/0217675 A1 | 8/2012 | Usui |
| 2012/0313293 A1 | 12/2012 | Wakabayashi |
| 2013/0015597 A1* | 1/2013 | Hattori ............... G03F 7/0002 264/40.1 |
| 2013/0224322 A1 | 8/2013 | Shizawa |
| 2014/0070437 A1 | 3/2014 | Ota |
| 2014/0346700 A1 | 11/2014 | Sato |
| 2014/0367874 A1 | 12/2014 | Yamamoto |
| 2015/0001746 A1 | 1/2015 | Miyajima |
| 2015/0049317 A1 | 2/2015 | Mishima |
| 2015/0174816 A1 | 6/2015 | Mizuno |
| 2015/0192529 A1 | 7/2015 | Sato |
| 2015/0338751 A1 | 11/2015 | Ogura |
| 2016/0016353 A1 | 1/2016 | Yamamoto |
| 2016/0136872 A1 | 5/2016 | Yanagisawa |
| 2016/0236381 A1 | 8/2016 | Takemura |
| 2017/0016112 A1 | 1/2017 | Tanaka |

FOREIGN PATENT DOCUMENTS

| | | |
|---|---|---|
| JP | 2005-116978 A | 4/2005 |
| JP | 2006-165371 A | 6/2006 |
| JP | 2007-103924 A | 4/2007 |
| JP | 2007-230229 A | 9/2007 |
| JP | 2007-281072 A | 10/2007 |
| JP | 2009016000 A | 1/2009 |
| JP | 2009-088264 A | 4/2009 |
| JP | 2009-266841 A | 11/2009 |
| JP | 2010-093187 A | 4/2010 |
| JP | 2010-225693 A | 10/2010 |
| JP | 2011009250 A | 1/2011 |
| JP | 2011097025 A | 5/2011 |
| JP | 2012-054322 A | 3/2012 |
| JP | 2012084732 A | 4/2012 |
| JP | 2012134558 A | 7/2012 |
| JP | 2012-186390 A | 9/2012 |
| JP | 2012-238674 A | 12/2012 |
| JP | 2013-008911 A | 1/2013 |
| JP | 2013-026436 A | 2/2013 |
| JP | 2013026288 A | 2/2013 |
| KR | 10-2003-0079909 A | 10/2003 |
| KR | 10-2008-0103834 A | 11/2008 |
| KR | 10-0916177 B1 | 9/2009 |
| KR | 10-2012-0098427 A | 9/2012 |
| KR | 10120102014 A | 9/2012 |
| KR | 20120102014 A | 9/2012 |
| KR | 10-2013-0009630 A | 1/2013 |
| TW | 201302419 A | 1/2013 |

\* cited by examiner

EXPOSURE STEP

EXPOSURE STEP

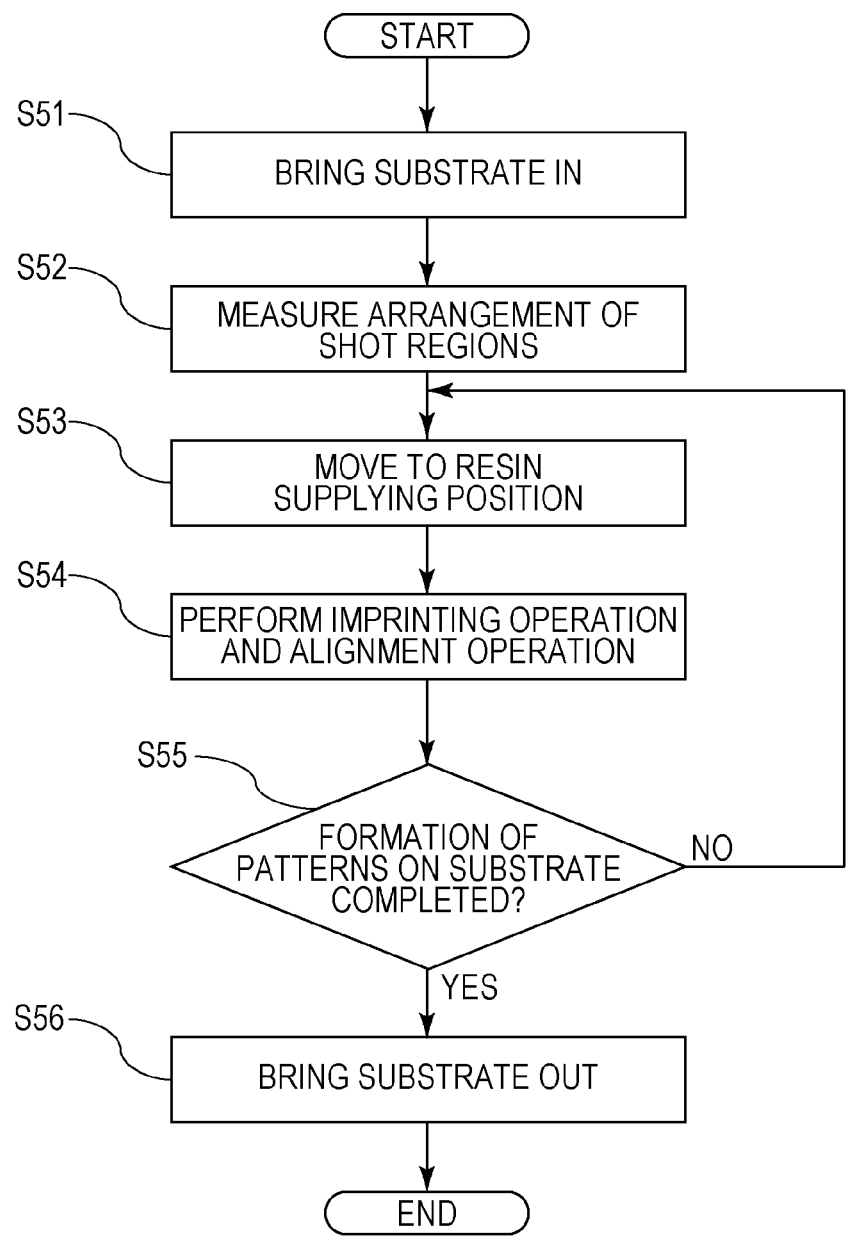

IMPRINTING APPARATUS, DEVICE FABRICATION METHOD, AND IMPRINTING METHOD

BACKGROUND OF THE INVENTION

Field of the Invention

Embodiments disclosed herein relate to an imprinting apparatus configured to form a pattern on a resin on a substrate using a mold, a device fabrication method for fabricating a device by using the imprinting apparatus, and an imprinting method.

Description of the Related Art

The imprinting technology is known as a technology for fabricating devices such as semiconductor devices. The imprinting technology enables formation of a pattern on a resin by supplying an uncured resin onto a substrate and curing the resin in contact with a mold (corresponding to a reticle). For the imprinting technology, there are some imprinting methods such as thermal imprinting based on thermal deformation of a resin and photo-imprinting in which a resin is cured by light.

During fabrication of a device, a process of etching an underlying layer or implanting ions into a substrate is repeatedly performed using a pattern formed on a resin as a mask. Accordingly, it is essential to accurately align an upper-layer pattern relative to a lower-layer pattern in order to ensure the specs of a device.

In general, photolithography apparatuses have an alignment function for correcting a relative misalignment (alignment error) between a pattern on a reticle and a pattern on a substrate.

Imprinting apparatuses are also desired to have such an alignment function of photolithography apparatuses. Photolithography apparatuses do not bring a reticle into contact with a substrate, whereas imprinting apparatuses bring a mold into contact with a substrate with a resin interposed therebetween. Accordingly, Japanese Patent Laid-Open No. 2006-165371 discloses that a relative misalignment between a substrate and a mold is measured after the mold is brought into contact with a resin disposed on the substrate and alignment of the substrate and the mold is performed by correcting this misalignment before the resin is cured.

However, it was found that, even if a relative misalignment between a substrate and a mold is corrected after the mold is brought into contact with a resin and then the resin is cured, a relative misalignment between a pattern on the cured resin disposed on the substrate and a pattern on an underlying layer still occurs. At least one of major causes of this relative misalignment is related to shrinkage of a resin. After curing of a resin is started, the resin continues to shrink until it is fully cured (until the end of curing), and consequently stress is applied to the mold as the resin shrinks. It was found that this stress applied to the mold causes the relative misalignment between the substrate and the mold.

For this reason, a relative misalignment between a pattern on a cured resin disposed on a substrate and a pattern on an underlying layer needs to be inspected (overlay inspection). In the related art, the relative misalignment is inspected in the following manner. After patterns are transferred to all shot regions on a substrate by an imprinting apparatus, the substrate is transported into an overlay inspection apparatus different from the imprinting apparatus for inspection. Because inspection is performed after patterns are transferred to all shot regions and then the substrate is transported into the overlay inspection apparatus, the inspection of the relative misalignment takes time, resulting in a decrease in productivity.

SUMMARY OF THE INVENTION

Embodiments of the present invention provide an imprinting apparatus capable of reducing a decrease in productivity by reducing the time taken for inspection of a relative misalignment caused during curing of a resin.

An embodiment of the present disclosure provides an imprinting apparatus that imprints a pattern on a resin on a substrate using a mold, including a detector configured to detect a mold mark provided on the mold and a substrate mark provided on the substrate; a driving unit configured to change relative positions of the mold and the substrate; a curing unit configured to cure the resin; and a controller configured to control operations performed by the detector, the driving unit, and the curing unit, wherein the controller is configured to perform an alignment step of controlling the driving unit in accordance with the mold mark and the substrate mark detected by the detector so as to perform alignment, a curing step of causing the curing unit to cure the resin in contact with the mold after the alignment step, and a detection step of causing the detector to detect the mold mark and the substrate mark after the curing step so as to determine an amount of relative misalignment between the mold and the substrate after the resin has been cured.

Further features of the present invention will become apparent from the following description of exemplary embodiments with reference to the attached drawings.

BRIEF DESCRIPTION OF THE DRAWINGS

FIG. 5 is a diagram illustrating the flow of an imprinting process according to the first embodiment.

DESCRIPTION OF THE EMBODIMENTS

Figure 1:
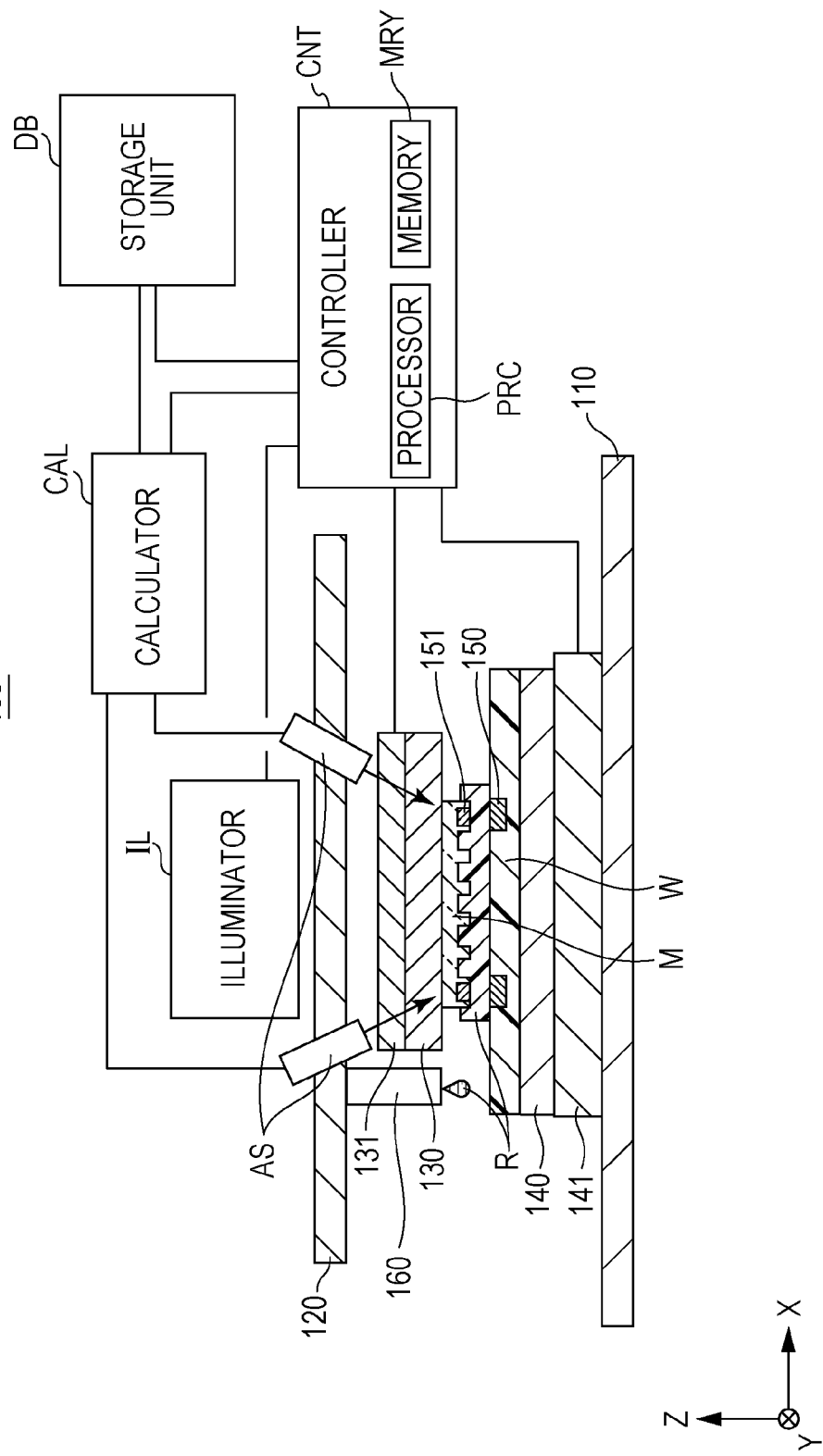
FIG. 1 is a diagram illustrating the configuration of an imprinting apparatus.

The following describes exemplary embodiments of the present invention in detail with reference to the accompanying drawings. Throughout the drawings, similar components are denoted by similar reference numerals so as to omit a duplicated description.

First Embodiment

Regarding Imprinting Apparatus

Referring to FIG. 1, an imprinting apparatus 100 will be described. Herein, the description will be given of the imprinting apparatus 100 that employs a photo-imprinting method in which a resin disposed on a substrate W is cured through irradiation of ultraviolet light.

The imprinting apparatus 100 performs an imprinting operation so as to form a pattern on the substrate W. The imprinting apparatus 100 is capable of forming patterns in a plurality of shot regions on the substrate W by repeatedly performing the imprinting operation. In a single imprinting operation, a resin disposed on the substrate W is cured in contact with a mold M (corresponding to a reticle) having a pattern thereon and then the space between the mold M and the substrate W is increased so as to form a pattern on the substrate W.

The imprinting apparatus 100 includes an illuminator IL (curing unit) configured to radiate ultraviolet light, and detectors AS each configured to detect a mark formed on the mold M and a mark formed on the substrate W. The imprinting apparatus 100 also includes a structure 120 arranged to support the detectors AS, a mold holder 130 arranged to hold the mold M, and a substrate holder 140 arranged to hold the substrate W.

The imprinting apparatus 100 also includes a mold stage 131 (mold driving unit) arranged to move the mold holder 130 at least in the z-axis direction which is orthogonal to the substrate W. The mold stage 131 holds the mold holder 130 and moves the mold holder 130 in the z-axis direction, thereby being able to bring the mold M into contact with a resin disposed on the substrate W. The mold stage 131 may perform rotational diving in the x-axis or y-axis direction or with respect to each axis.

The imprinting apparatus 100 also includes a substrate stage 141 (substrate driving unit) arranged to move the substrate holder 140 at least in the x-axis and y-axis directions which are parallel to the substrate W. The substrate stage 141 holds the substrate holder 140 and is provided on a structure 110. The substrate stage 141 may perform rotational driving in the z-axis direction or with respect to each axis.

The imprinting apparatus 100 includes the structure 110 arranged to support the substrate holder 140, and a supplier 160 (dispenser) configured to supply a resin R onto the substrate W. The mold M is made of a light-transmittable material, such as quartz, so as to allow the resin R to be irradiated with ultraviolet light from the illuminator IL.

The imprinting apparatus 100 further includes a controller CNT configured to control operations of the mold holder 130 and the substrate holder 140, a calculator CAL configured to calculate relative positions of the mold M and the substrate W using a detection result obtained by the detectors AS, and a storage unit DB configured to store the detection result obtained by the detectors AS and the calculation result obtained by the calculator CAL.

Here, the case has been described in which the controller CNT, the calculator CAL, and the storage unit DB are included in the imprinting apparatus 100; however, these components may be provided outside the imprinting apparatus 100. In such a case, the imprinting apparatus 100 exchanges information with a computer (including the controller CNT, the calculator CAL, and the storage unit DB) via a network, for example. The computer may be an imprinting system configured to control imprinting operations of a plurality of imprinting apparatuses by exchanging information with the plurality of imprinting apparatuses. The controller CNT includes a memory MRY storing a program for controlling operations of the imprinting apparatus 100, and a processor PRC configured to execute the program stored in the memory MRY. In accordance with the executed program, the controller CNT outputs signals for controlling the individual components of the imprinting apparatus 100.

The storage unit DB alone may be provided outside the imprinting apparatus 100, and may be included in an imprinting system in which one storage unit DB is provided for a plurality of imprinting apparatuses. The storage unit DB provided outside the imprinting apparatus 100 may be connected to a plurality of photolithography apparatuses as well as the imprinting apparatus 100. A server provided outside the imprinting apparatus 100 may be used as the storage unit DB in order to collect information regarding exposure conditions and manage appropriate apparatus parameters corresponding to a mold and substrate to be used.

Alignment Operation

Alignment marks (substrate marks 150) formed on the substrate W and alignment marks (mold marks 151) formed on the mold M are used for alignment of the mold M and the substrate W. The substrate W and the mold M are arranged so that the substrate mark 150 and the corresponding mold mark 151 overlap with each other. In this state, for example, an image of the substrate mark 150 and the mold mark 151 or an interference pattern caused by interference between the substrate mark 150 and the mold mark 151 is detected by the detector AS, such as an alignment scope. Alignment is performed by an alignment unit (described later) including the detectors AS and the controller CNT. Each of the detectors AS is an alignment scope which includes an illumination system configured to illuminate the marks and a photodetector element configured to receive an image or interference pattern of the marks.

Based on the detection result obtained by the detectors AS, the calculator CAL determines a relative misalignment (alignment error) between the substrate W and the mold M before curing of the resin R. The relative misalignment between the substrate W and the mold M before curing of the resin R is quantitatively determined as a value by the calculator CAL included in the alignment unit on the basis of the detection result obtained by the detectors AS by detecting the substrate marks 150 and the mold marks 151. The controller CNT receives the calculation result obtained by the calculator CAL as its input value, and outputs a signal for driving the mold stage 131 or the substrate stage 141 included in the alignment unit. The mold stage 131 or the substrate stage 141 is moved in accordance with the signal output from the controller CNT. In this way, the relative positions of the mold M and the substrate W are changed, and consequently the mold M and the substrate W are aligned. Note that both the mold stage 131 and the substrate stage 141 may be driven simultaneously or sequentially.

The relative misalignment between the mold M and the substrate W caused before curing of the resin R is reduced (decreased) by driving the mold stage 131 and the substrate stage 141 in this way. In addition to changing the relative positions of the mold M and the substrate W, the imprinting apparatus 100 may deform the mold M. Alignment is performed by adjusting the shape and size (magnification) of a pattern on the mold M in accordance with an imprinting region (shot region) of the substrate W. As described above, the alignment unit may include a deformation mechanism configured to deform the mold M. That is, the alignment operation may include deforming the shape and size of the mold M by the deformation mechanism on the mold holder 130.

The resin R is supplied to the shot region of the substrate W by the supplier 160 included in the imprinting apparatus 100. The controller CNT controls the amount of resin R to be supplied by the supplier 160 and a timing at which the resin R is to be supplied. As described above, the controller CNT receives the calculation result obtained by the calculator CAL as its input value. Information regarding a relative misalignment between the mold M and the substrate W after curing of the resin R determined from the detection result obtained by the detectors AS may be used for controlling the supplier 160 or the substrate holder 140 at least when the resin R is to be supplied to the next shot region on the substrate W. The larger the amount of resin R supplied to the substrate W becomes, the larger the relative misalignment between the mold M and the substrate W after curing of the resin R sometimes becomes. Accordingly, in accordance with the amount of relative misalignment between the mold M and the substrate W after curing of the resin R, the controller CNT controls the amount of resin R to be supplied by the supplier 160 or the position of a nozzle to be used, and moves the substrate holder 140 so as to locate the shot region under the supplier 160.

The radiation duration and radiation amount of light radiated from the illuminator IL are changed in accordance with a kind and an amount of resin R supplied onto the substrate W. The controller CNT controls the radiation duration and radiation amount of the illuminator IL. Information regarding the relative misalignment between the mold M and the substrate W after curing of the resin R determined from the detection result obtained by the detectors AS may be used for controlling the illuminator IL at least when the resin R in the next shot region on the substrate W is cured. The longer the exposure period for curing the resin R supplied onto the substrate W becomes, the larger the relative misalignment between the mold M and the substrate W after curing of the resin R sometimes becomes. Accordingly, in accordance with the amount of relative misalignment between the mold M and the substrate W after curing of the resin R, the controller CNT can change the radiation duration and radiation amount of light radiated from the illuminator IL.

Imprinting Operation

Figure 2:
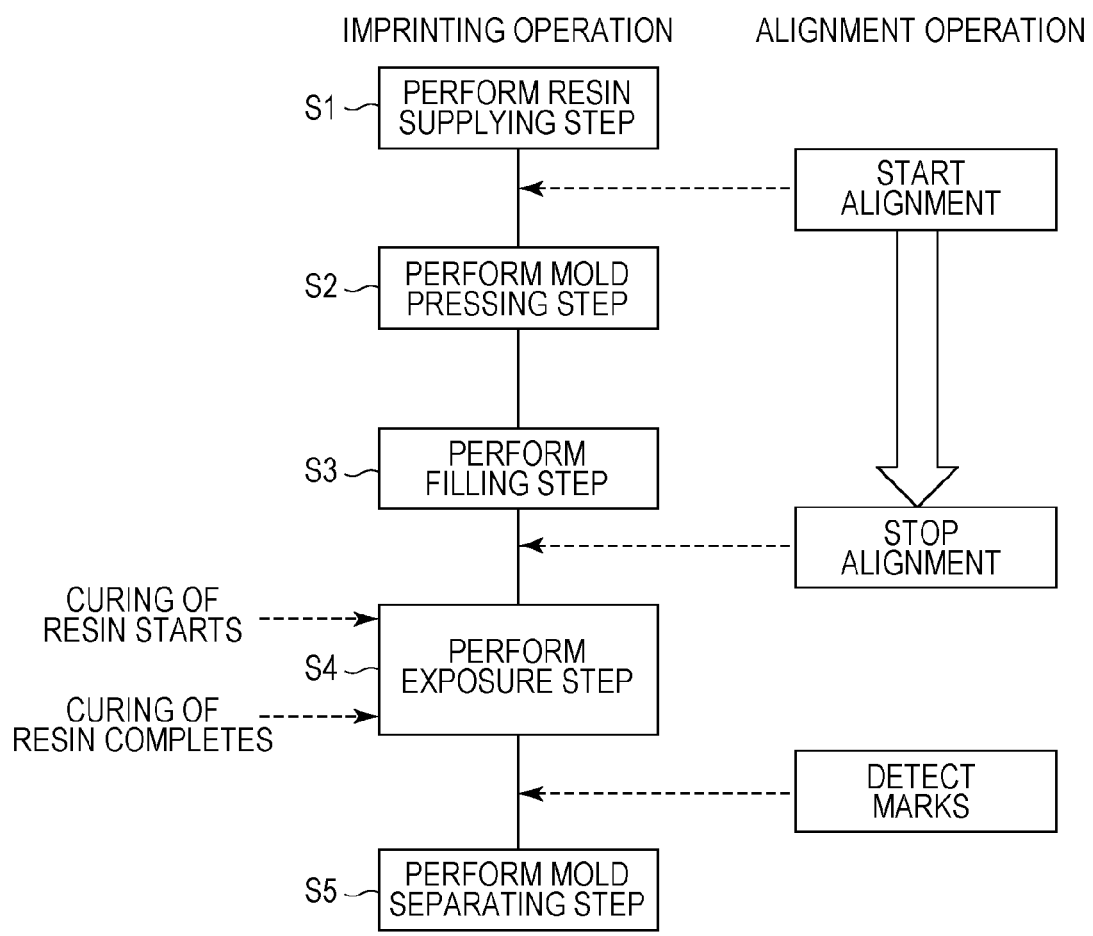
FIG. 2 is a diagram illustrating an imprinting operation and an alignment operation according to a first embodiment.

The imprinting operation will be described with reference to FIG. 2. FIG. 2 is a diagram illustrating a process of a single imprinting operation (for one shot region). In the case of performing imprinting for a plurality of shot regions on the substrate W, the imprinting operation illustrated in FIG. 2 is repeatedly performed. The imprinting operation described here is performed by the imprinting apparatus 100 as a result of the processor PRC executing the program stored in the memory MRY included in the controller CNT.

In step S1, the resin R is supplied to a shot region on the substrate W by the supplier 160 (resin supplying step). Arrangement information regarding arrangement of resin droplets to be supplied onto the substrate W is stored in advance in the memory MRY of the controller CNT. The supplier 160 is controlled to supply the resin R in accordance with the arrangement information. The arrangement information of resin droplets is decided taking into consideration of arrangement of patterns on the mold M used and residual layer thickness (RLT). For example, in the case where RLT is made large, the resin R is supplied in accordance with the arrangement information that makes the intervals between droplets narrow and a density of droplets high. Here, RLT refers to thickness of the resin R between the surface (bottom surface) of a concave of a concave-convex pattern formed by the cured resin R and the surface of the substrate W at the time of imprinting.

In step S2, a pattern formed on the mold M is brought into contact with the resin R disposed on the substrate W (mold pressing step). After the resin R is supplied to the shot region on the substrate W in the resin supplying step (S1), the substrate stage 141 is driven to move the substrate W so that the shot region on the substrate W opposes the corresponding shot region formed on the mold M. After the substrate W is moved, the mold stage 131 is driven so as to bring the mold stage 131 close to the substrate stage 141 and consequently bring the pattern on the mold M into contact with the resin R disposed on the substrate W (mold pressing step). If the detectors AS can detect the alignment marks before the pattern comes into contact with the resin R, alignment can be started before the contact.

In step S3, the pattern on the mold M is filled with the resin R (filling step). The filling step often takes a certain period in order to sufficiently fill (immerse) the pattern on the mold M with the resin R. In the filling step, the relative positions of the mold M and the substrate W are adjusted and the pattern on the mold M is filled with the resin R so as to avoid insufficient filling of the pattern on the mold M with the resin R when the resin R is cured. By appropriately setting the period taken for the filling step, insufficient filling of the pattern can be reduced. After the mold M is brought into contact with the substrate W with the resin R interposed therebetween, alignment is continuously performed in order to correct the relative misalignment caused by contact of the mold M and the resin R before curing of the resin R.

In step S4, the illuminator IL (curing unit) radiates ultraviolet light (exposure light) to the resin R in order to cure the resin R (exposure step). It is generally considered that curing of the resin R starts upon ultraviolet light reaching the resin R from the illuminator IL serving as the curing unit. Thus, it is assumed that the timing at which curing of the resin R starts is the timing at which radiation of the exposure light is started. After curing of the resin R starts, alignment of the mold M and the substrate W is not performed because alignment possibly causes damages on the pattern or insufficient filling of the pattern with the resin R. Also, even if the detectors AS attempt to detect the alignment marks in the exposure step (curing step), the detectors AS are unable to detect the alignment marks because the exposure light serves noise and the relative misalignment before curing of the resin R cannot be determined in some cases.

After curing of the resin R completes in step S4, the mold stage 131 is driven so as to increase the space between the mold M and the substrate W and consequently separate the mold M from the cured resin R in step S5 (mold separating step). Alternatively, the mold separating step may be performed by simultaneously or sequentially driving both the mold stage 131 and the substrate stage 141. Through the mold separating step, a desired pattern is formed (transferred) on the substrate W, and the sequence of the imprinting operation completes.

Alignment During Imprinting

Figure 3A:
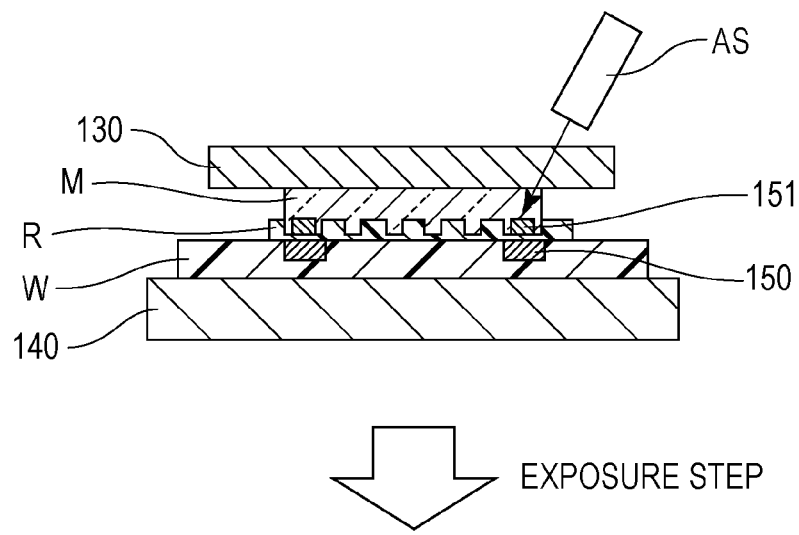
FIGS. 3A and 3B are diagrams illustrating how a relative misalignment caused during an exposure step is measured in the first embodiment.
Figure 3B:
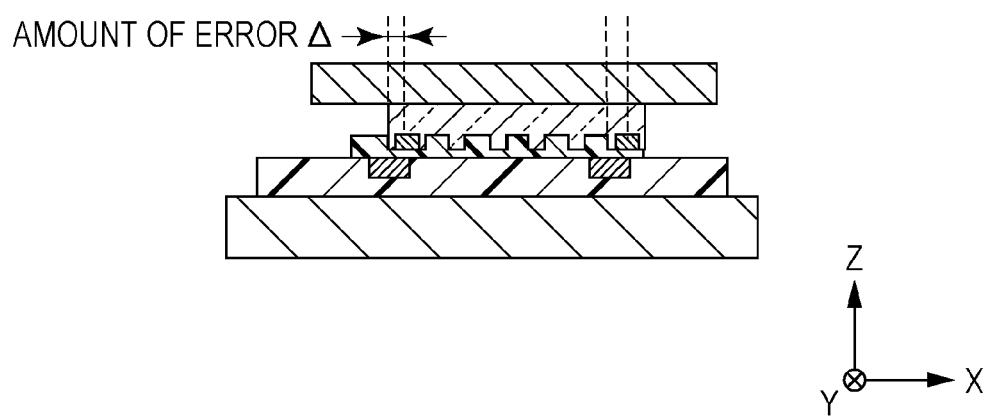
Figure 4A:
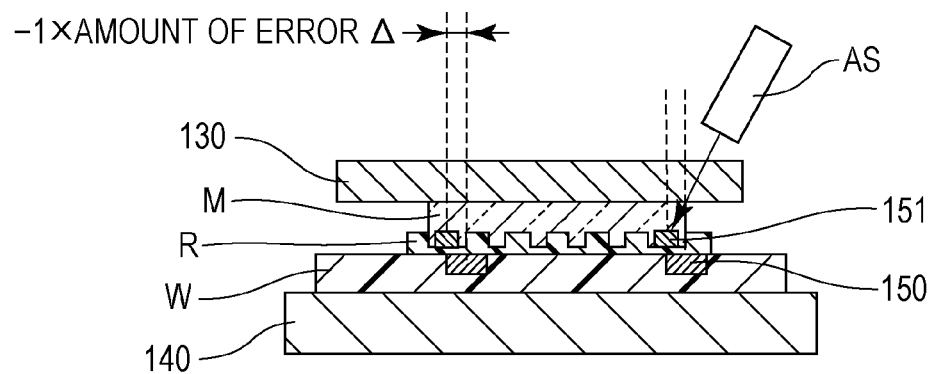
FIGS. 4A and 4B are diagrams illustrating how a relative misalignment caused during the exposure step is corrected in the first embodiment.
Figure 4B:
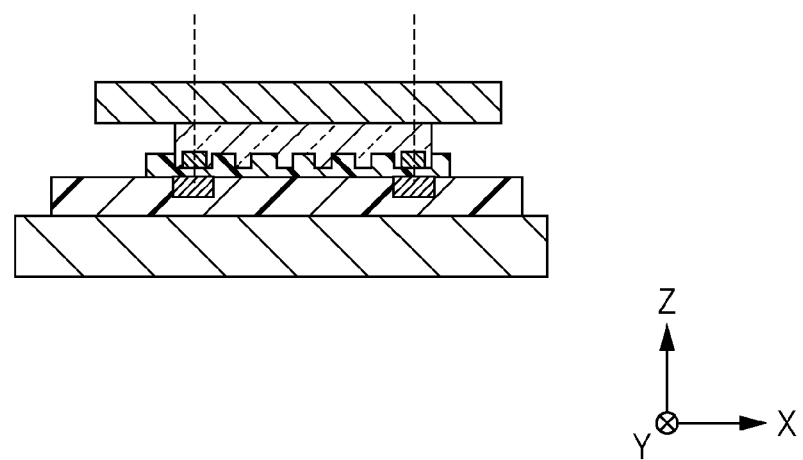

An alignment operation according to the first embodiment of the present invention will be described with reference to FIGS. 2 to 4B. FIGS. 3A and 3B are diagrams illustrating how alignment is performed when a pattern is formed in a first shot region on a first substrate. FIGS. 4A and 4B are diagrams illustrating how alignment is performed when a pattern is formed in each of second and subsequent shot regions on the first substrate.

FIG. 3A illustrates how alignment is performed before the exposure step (S4) is started. The substrate W supplied with the resin R in the resin supplying step (S1) is moved so as to be located under the mold M. The alignment operation (alignment step) is started before the mold pressing step (S2). Specifically, the detectors AS included in the alignment unit detect the mold marks 151 and the substrate marks 150. The pattern on the mold M is brought into contact with the resin R disposed on the substrate W while performing alignment of the mold M and the substrate W. When the imprinting operation is performed, alignment is continued during the mold pressing step (S2) and the filling step (S3) up until radiation of exposure light (curing of the resin R) is started as illustrated in FIG. 2. The alignment step may be stopped at the same time as when radiation of exposure light (curing of the resin R) is started.

By continuously performing the alignment operation until immediately before curing of the resin R starts in response to radiation of exposure light, the relative misalignment between the mold M and the substrate W before curing of the resin R is reduced. The alignment operation is stopped (alignment is stopped) after the relative misalignment before curing of the resin R becomes smaller than or equal to an allowable value.

As described before, alignment is stopped from when the pattern-filling resin R is started to be exposed to exposure light to when curing of the resin R completes. While the resin R is being cured, the resin R shrinks. Thus, stress is applied to the mold M as the resin R shrinks while the resin R is being cured. The relative positions of the mold M and the substrate W change owing to the influence of the stress caused by shrinkage of the resin R, and consequently a relative misalignment may be caused after curing of the resin R. For this reason, the relative misalignment after the completion of curing of the resin R may be larger than that determined before curing of the resin R is started (when alignment is stopped). Alignment cannot be performed during the exposure step and after the completion of curing of the resin R; however, the alignment marks can be detected by the detectors AS before the mold separating step is started.

FIG. 3B illustrates how the alignment marks are detected after the completion of the exposure step (S4). The imprinting process according to the first embodiment includes a step of determining a relative misalignment between the mold M and the substrate W, which follows the exposure step (curing step). In the step of determining the relative misalignment, the detectors AS detect the alignment marks after the completion of curing of the resin R. As illustrated in FIG. 2, detection of the alignment marks is performed between the exposure step and the mold separating step, and the relative misalignment after curing of the resin R is quantitatively determined as a value by a relative-misalignment determination unit. Note that detection of the alignment marks may be performed at the same time as the completion of the exposure step or the completion of curing of the resin R.

Here, the relative-misalignment determination unit includes the calculator CAL configured to determine the relative misalignment between the mold M and the substrate W after curing of the resin R on the basis of the detection result of the alignment marks obtained by the detectors AS. The alignment unit and the relative-misalignment determination unit include the same calculator CAL. The relative-misalignment determination unit also includes the detectors AS. The alignment unit and the relative-misalignment determination unit may include the same or different detectors AS. Suppose that the relative misalignment between the mold M and the substrate S that is determined by the calculator CAL after the resin R is cured is denoted by an amount of error Δ caused during the exposure step. Alternatively, a difference between relative misalignments determined before (when alignment is stopped) and after the exposure step may be denoted by the amount of error Δ caused during the exposure step. By determining the difference between the relative misalignment before the exposure step and the relative misalignment after the exposure step, an amount of relative misalignment caused by curing of the resin R (caused during the exposure step) can be accurately determined.

A timing at which the alignment marks are detected after the completion of curing of the resin R may be after the completion of the mold separating step.

Experiments have confirmed that the larger the amount of resin R to be cured, the larger the amount of error Δ caused during the exposure step. The longer the exposure period taken to cure the resin R in the exposure step, the larger the amount of error Δ caused during the exposure step. The amount of exposure (amount of irradiation) needed to cure the resin R is proportional to intensity of light from a light source and the exposure period. Accordingly, the lower the intensity of light radiated from the light source, the longer the exposure period; the higher the intensity of light, the shorter the exposure period.

The necessary amount of irradiation changes depending on the amount of resin R supplied onto the substrate W. Specifically, the larger the amount of resin R, the larger the necessary amount of irradiation. The amount of resin R changes depending on a density of a pattern formed on the mold M and the residual layer thickness. Also, the necessary amount of irradiation changes depending on a kind of the resin R used for imprinting.

Referring to FIGS. 4A and 4B, a description will be given of a method for improving alignment accuracy using the amount of error Δ caused in the first shot region during the exposure step. It has been found that the relative misalignment caused during curing of the resin R occurs in a similar direction in accordance with the kinds of the substrate W and resin R used. Accordingly, it can be considered that substantially the same amount of error as the amount of error Δ obtained by detecting the alignment marks in the first shot region will occur in second and subsequent shot regions during the exposure step. Thus, as illustrated in FIG. 4A, an alignment target value is set for the second and subsequent shot regions on the assumption that a misalignment substantially equal to the amount of error Δ determined for the first shot region will occur during the exposure step and alignment is performed. Specifically, alignment is performed such that the mold M is shifted relative to the substrate W (by an amount of −1× the amount of error Δ) in a direction opposite to the direction in which the amount of error Δ is caused. The distance over which the substrate stage 141 is moved in this case is equal to a difference between the relative misalignment between the mold M and the substrate W before curing of the resin R detected by the detectors AS in the second shot region when the alignment operation is started and the relative misalignment between the mold M and the substrate W determined for the first shot region after the resin R is cured. The substrate stage 141 is moved so that the relative misalignment in the second shot region before the resin R is cured is equal to the amount of error Δ determined for the first shot region.

After alignment is performed in accordance with the amount of error Δ, the resin R is cured in the exposure step. Suppose that the amount of error caused in each of the second and subsequent shot regions during the exposure step is substantially equal to the amount of error Δ caused in the first shot region during the exposure step. In this case, the post-curing alignment accuracy can be improved as illustrated in FIG. 4B.

It is also considered that the amount of error Δ caused during the exposure step may change depending on the position of the shot region on the substrate W. Because the pattern formed on the mold M partially contacts the resin R in shot regions such as edge shot regions on a wafer, stress applied to the mold M and the substrate W in these regions during the mold pressing differs from that of the other shot regions. For this reason, a large amount of error may occur in shot regions such as edge shot regions because of other factors as well as stress caused by shrinkage of the resin R. It has been found that such an error occurs in a similar direction depending on the position of the shot region on the wafer. In such a case, an amount of error caused during the exposure step is determined for each shot region formed on the first substrate. Alignment may be performed by using the amount of error Δ determined for each shot region of the first substrate for a corresponding shot region of second and subsequent substrates. For example, the amount of error Δ determined for the first shot region of the first substrate is used in alignment for the first shot region of the second and subsequent substrates. Further, the amount of error Δ determined for the second shot region of the first substrate is used in alignment for the second shot region of the second and subsequent substrates. Similarly, the amount of error Δ determined for the N-th shot region of the first substrate is used in alignment for the N-th shot region of the second and subsequent substrates.

Also, the amount of error Δ caused in shot regions near the periphery of the substrate W during the exposure step may be larger than that of shot regions near the center of the substrate W because of the influence of warping of the substrate W or the like. In such a case, when a pattern is formed in shot regions near the periphery, the amount of error Δ caused during the exposure step may be used in alignment.

The relative misalignment that remains after the resin R is cured changes depending on the amount and kind of resin R supplied onto the substrate W and the relative positions of the mold M and the substrate W at the time of mold pressing as well as the position of the shot region on the substrate W. Also, such relative misalignment may change depending on the time taken for the filling step, the intensity of exposure light, the irradiation duration of exposure light, etc.

Accordingly, it may be effective to use the information of the amount of error Δ in control of the resin supplying step and control of the amount of irradiation as well as alignment so as to use the information of the amount of error Δ for the second and subsequent shot regions. For example, the amount of resin R to be supplied onto the substrate W may be reduced or the intensity of exposure light may be increased so as to shorten the exposure period. Also, in order to confirm a correlation between the amount of error Δ and exposure conditions, parameter information regarding exposure conditions generated by the imprinting apparatus 100 and the relative misalignment that remains after curing of the resin R can be stored in the storage unit DB so as to determine parameters of optimum exposure conditions.

Upon the completion of curing of the resin R (completion of the exposure step), the relative positions of the shot region on the substrate W and the pattern formed on the resin R are decided. That is, the relative misalignment between the mold M and the substrate W obtained after the completion of curing of the resin R is likely to have a high correlation with the relative misalignment obtained after the completion of the mold separating operation by an overlay inspection apparatus provided outside the imprinting apparatus 100. For this reason, the relative misalignment that remains after curing of the resin R can replace work for inspecting the relative misalignment performed by an external overlay inspection apparatus in the related art. Specifically, it can be determined whether or not a shot region having a pattern formed therein is defective by comparing the relative misalignment that remains after curing of the resin R with a predetermined determination reference (reference value).

If the relative misalignment after curing of the resin R exceeds a required allowable value of device fabrication, the resulting device becomes defective. Thus, overlay inspection needs to be performed on the substrate having patterns formed thereon. In the related art, the substrate is transported from the imprinting apparatus to an external overlay inspection apparatus for inspection after patterns are formed in shot regions of the substrate. For this reason, the imprinting apparatus is prevented from forming patterns until determination as to whether or not shot regions having patterns therein are defective completes, resulting in a decrease in the productivity of the imprinting apparatus. Also, if a shot region includes a defective pattern, the resin on the substrate is sometimes removed and the pattern is formed again. In this case, it is necessary to transport the substrate to the external overlay apparatus after the re-formation of the pattern and to perform inspection in the related art. In the first embodiment of the present invention, the overlay inspection can be performed by the imprinting apparatus 100 immediately after the formation of the pattern. Thus, the time taken for the overlay inspection can be shortened. Also, the overlay inspection can be performed in each shot region immediately after a pattern is formed in the shot region. Thus, the inspection result can be used when a pattern is formed in another shot region of the wafer. As a result, a high-precision pattern transfer can be performed on the substrate.

FIG. 5 is a flowchart illustrating the flow of an imprinting process according to the first embodiment. This imprinting process is performed by the imprinting apparatus 100. The imprinting process illustrated in FIG. 5 is performed as a result of execution of the program stored in the memory MRY included in the controller CNT illustrated in FIG. 1. Also, the processor PRC included in the controller CNT processes the program stored in the memory MRY. As described above, the above-described imprinting operation according to the first embodiment of the present invention is executed in accordance with the program stored in the memory MRY included in the controller CNT.

After the start of the imprinting process, the substrate W is transported into the imprinting apparatus 100 (S51). Specifically, a substrate transporting unit (not illustrated) mounts the substrate W onto the substrate holder 140 from outside the imprinting apparatus 100.

After the substrate W is transported, arrangement of shot regions formed on the substrate W is measured (S52). Specifically, the detectors AS detect the alignment marks formed on the substrate W so as to determine arrangement (positions) of the shot regions formed on the substrate W. Off-axis alignment scopes configured to detect alignment marks without via the mold M may be used instead of the detectors AS.

After arrangement of the shot regions is measured, the substrate stage 141 is moved so as to supply the resin R to a shot region to which a pattern is to be transferred (S53). By moving the substrate stage 141, the shot region to which the resin R is to be applied is located under the supplier 160.

After the substrate W is moved, the above-described imprinting operation and alignment operation according to the first embodiment are performed (S54). In the imprinting operation, the steps (S1 to S5) described in FIG. 2 are performed. In the alignment operation (start/stop of alignment and detection of marks) is performed at timings illustrated in FIG. 2.

After the imprinting operation and alignment operation are performed, it is determined whether or not formation of patterns in the shot regions on the substrate W has completed (S55). If formation of the patterns has not completed, the process returns to step S53 in which the substrate stage 141 is moved so as to apply the resin R to the shot region in which a pattern is to be formed next. The imprinting operation and alignment operation are performed in S54 again.

After formation of the patterns has completed, the substrate W is transported from the imprinting apparatus 100 (S56). Specifically, the substrate transporting unit (not illustrated) transports the substrate W from the substrate holder 140 to outside the imprinting apparatus 100. Then, the imprinting process ends.

Second Embodiment

In the first embodiment described above, marks detected by the detectors AS after the exposure step (S4) are the same as the mold marks 151 and the substrate marks 150 detected during the alignment operation (alignment step); however, the marks detected after the completion of curing of the resin R are not limited to these marks and may be different marks.

Figure 6:
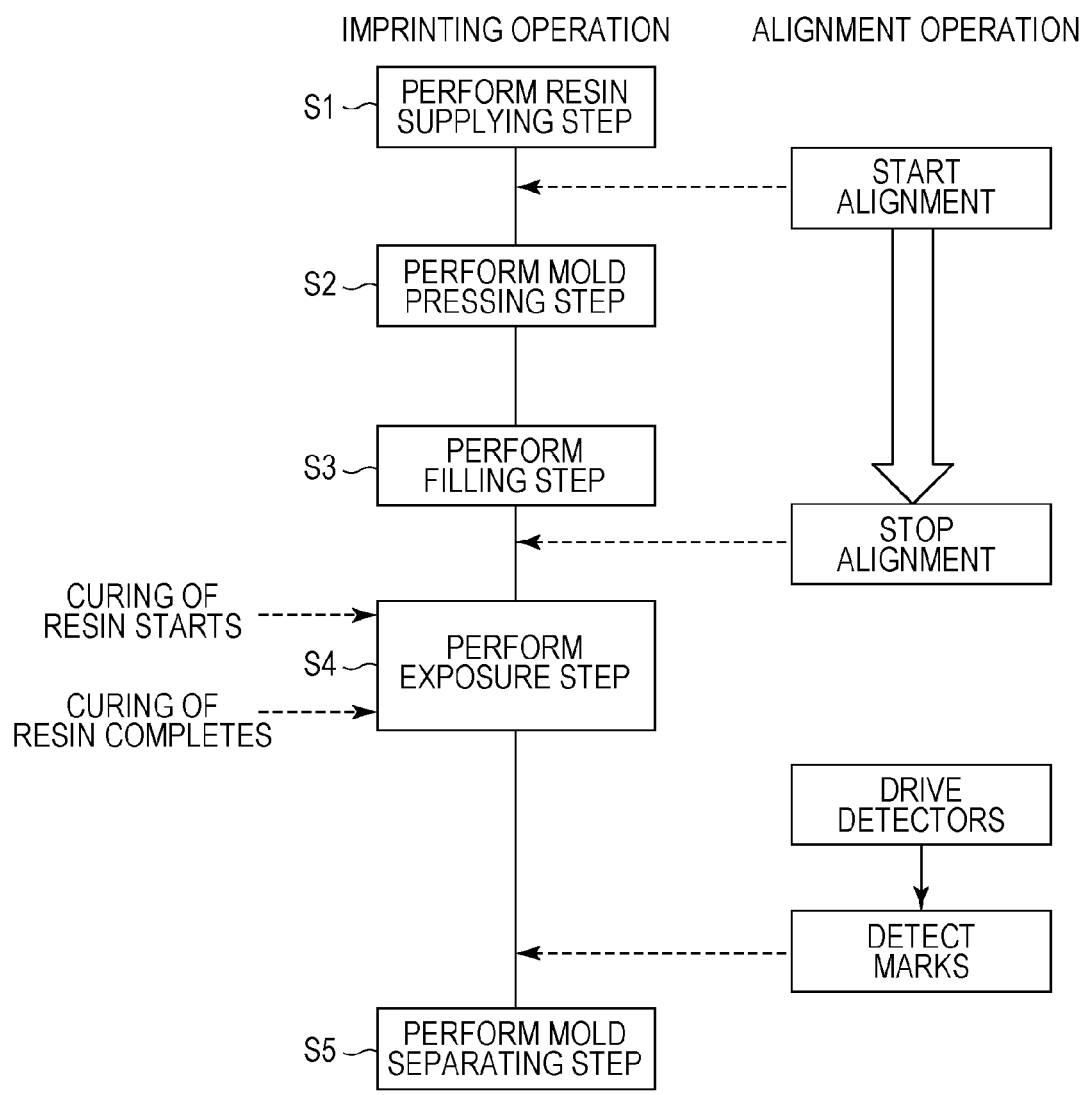
FIG. 6 is a diagram illustrating an imprinting operation and an alignment operation according to a second embodiment.

FIG. 6 illustrates an imprinting operation and an alignment operation according to a second embodiment. Before the detectors AS detect marks after the exposure step (S4), the detectors AS are moved (driving of scopes). Specifically, the detectors AS are moved so that marks different from the marks detected in the alignment step can be detected.

Figure 7:
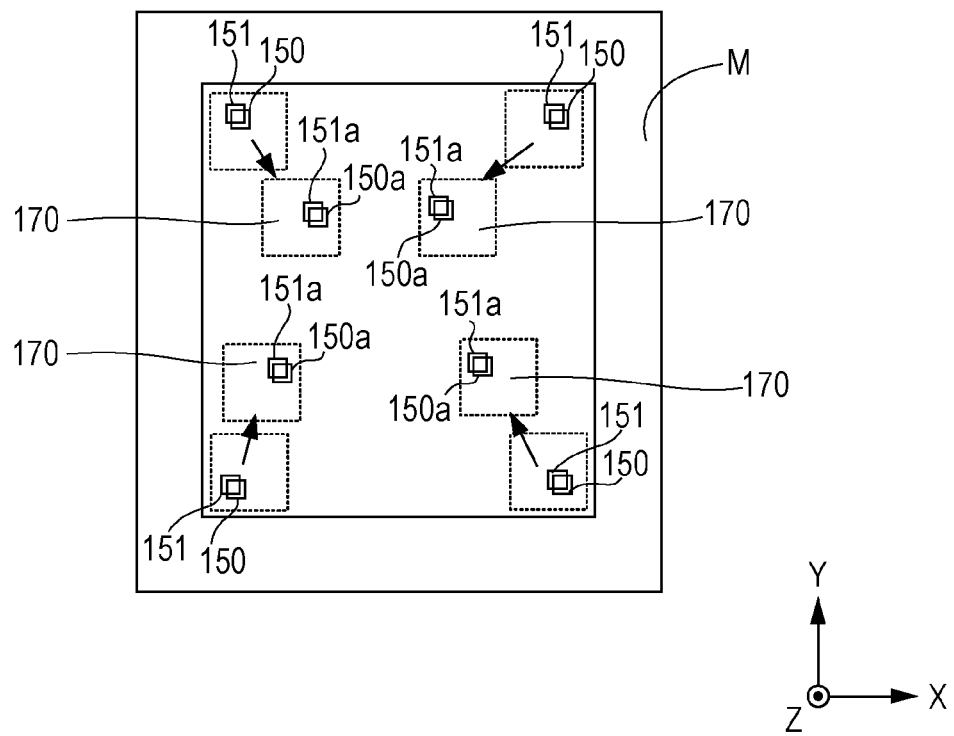
FIG. 7 is a diagram illustrating how detectors are moved and alignment marks in the second embodiment.

FIG. 7 illustrates marks formed on the mold M and the substrate W and how the detectors AS are moved in accordance with the second embodiment. As illustrated in FIG. 7, by driving the detectors AS in the x-axis and y-axis directions, measurement fields of view 170 of the detectors AS are moved to positions where other marks are formed on the mold M. By moving the detectors AS, mold marks 151a and substrate marks 150a that are different from the alignment marks detected during the alignment operation prior to the exposure step can be detected.

Figure 8:
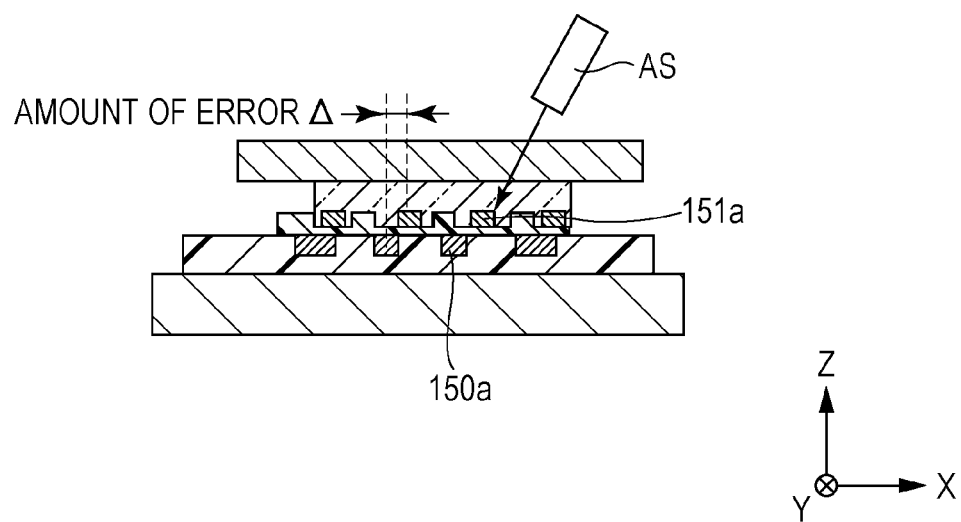
FIG. 8 is a diagram illustrating how a relative misalignment caused during the exposure step is measured in the second embodiment.

FIG. 8 illustrates how the mold marks 151a and the substrate marks 150a are detected after the completion of the exposure step (S4). The imprinting process according to the second embodiment includes a step of moving the detectors AS (driving of scopes) after the exposure step (curing step) and a step of determining a relative misalignment between the mold M and the substrate W after driving of the scopes. In the step of determining the relative misalignment, the detectors AS detect the mold marks 151a and the substrate marks 150a after the completion of curing of the resin R. Alternatively, the marks may be detected at the same time as the completion of curing of the resin.

Figure 9:
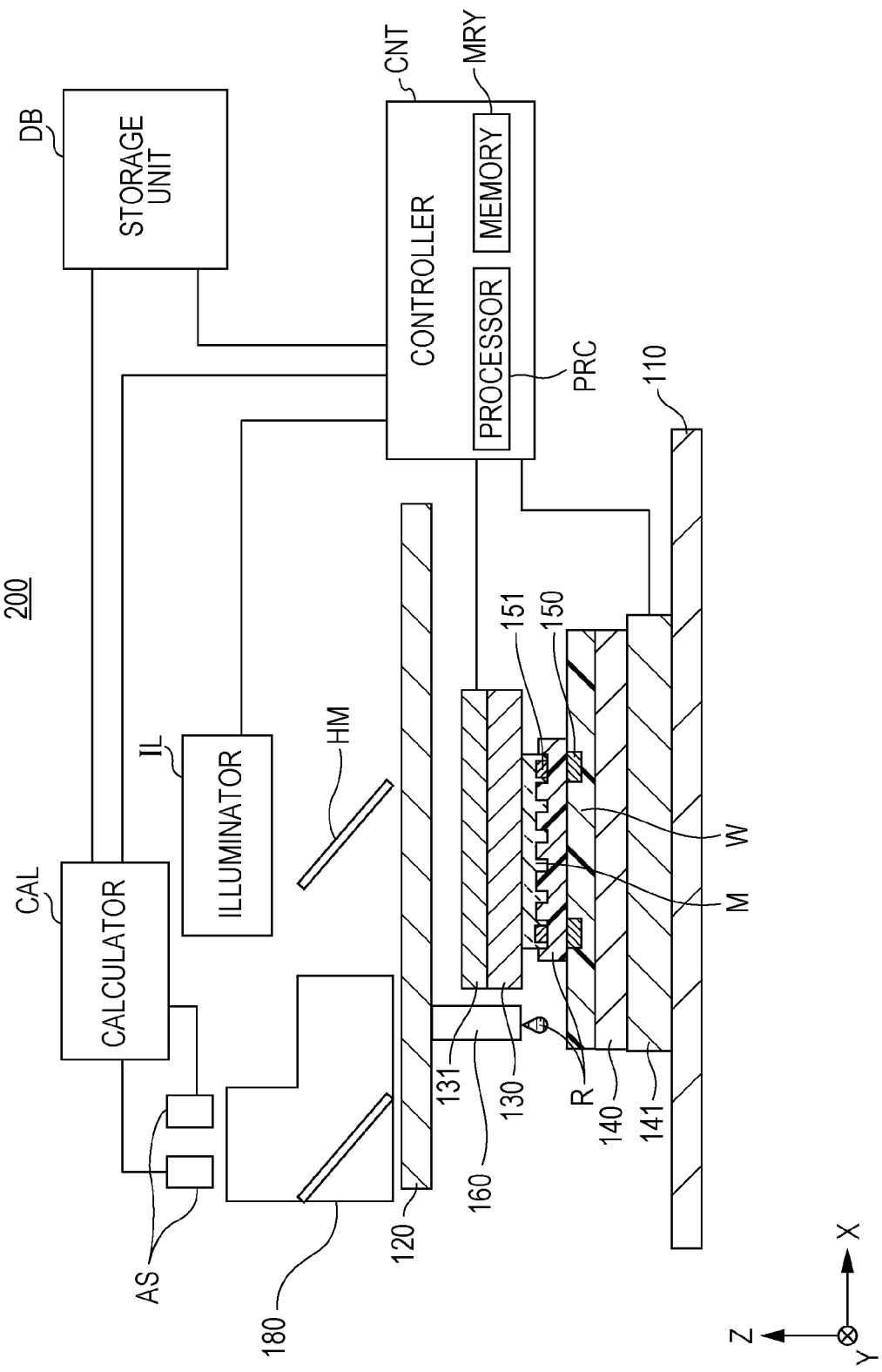
FIG. 9 is a diagram illustrating the configuration of an imprinting apparatus according to the second embodiment.

In the imprinting apparatus 100 illustrated in FIG. 1, exposure light radiated from the illuminator IL may possibly be blocked when the scopes are driven unless the driving is performed after the exposure step. In contrast, in an imprinting apparatus 200 illustrated in FIG. 9, driving of the scopes can be performed before and after the exposure step. In the imprinting apparatus 200 illustrated in FIG. 9, a light path along which exposure light radiated from the illuminator IL propagates and a light path used for detection of the alignment marks formed on the mold M and the substrate W are separated by a half mirror HM. The light path used for detection of the alignment marks includes an optical system 180 which includes optical elements such as a lens and a mirror. The detectors AS are able to detect the alignment marks formed on the mold M and the substrate W via the optical system 180. Because exposure light radiated from the illuminator IL is not blocked, the detectors AS may be moved during the exposure step.

In detection of the marks performed after the exposure step illustrated in FIG. 6, the measurement fields of view 170 of the detectors AS are moved by driving the scopes, and the detectors AS detect the mold marks 151a and the substrate marks 150a different from the mold marks 151 and the substrate marks 150 detected during the alignment operation.

Figure 10:
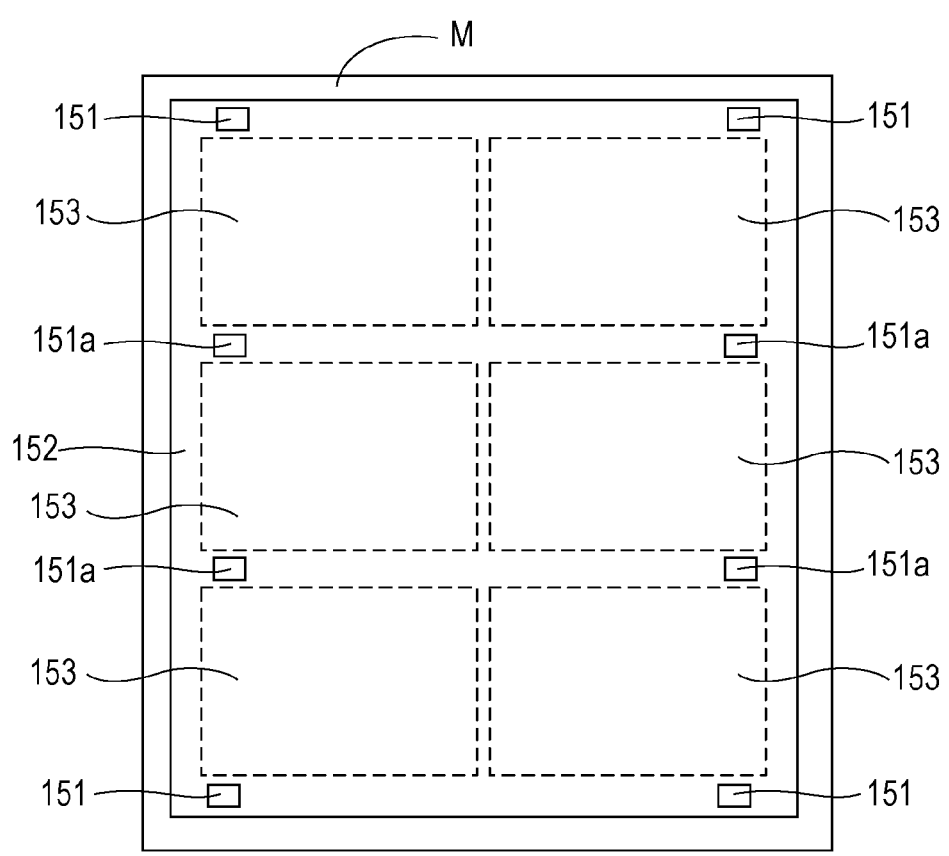
FIG. 10 is a diagram illustrating a mold and marks used in the second embodiment.

FIG. 10 is a diagram illustrating arrangement of alignment marks (the mold marks 151) and the mold marks 151a formed on the mold M used in the second embodiment and a shot region 152 including chip regions 153 having patterns formed therein. As illustrated in FIG. 10, the mold marks 151a formed on the mold M are arranged within a scribe line between the chip regions 153 of the shot region 152. Also, on the substrate W, the substrate marks 150 and 150a are formed at positions (in a corresponding shot region on the substrate W) corresponding to the positions of the mold marks 151 and 151a. The detectors AS are capable of detecting the mold marks 151a and the substrate marks 150a at the same time and measuring the relative misalignment. As in the first embodiment, the measurement result of the relative misalignment is used in the alignment operation before the exposure step is performed during the imprinting process for the subsequent shot regions or subsequent substrates. In this way, high-order correction can be performed.

Also, by repeatedly performing the above-described driving of the detectors AS and detection of the marks according to the second embodiment a plurality of times, the number of detected marks can be increased. Further, a configuration is also possible in which the mold marks 151 and the substrate marks 150 are detected after the exposure step as in the first embodiment and the detectors AS are driven to detect the mold marks 151a and the substrate marks 150a at different positions as in the second embodiment. By configuring each detector AS to detect the mold marks 151 and the substrate marks 150 at two or more positions in this way, high-order correction can be performed.

In the second embodiment, alignment marks (the mold marks 151 and the substrate marks 150) are arranged at four corners of each shot region, and other marks (the mold marks 151a and the substrate marks 150a) are arranged within a scribe line between chip regions; however, arrangement of the marks is not limited to this example. Also, in the second embodiment, the mold M and the substrate W each having the shot region 152 in which the six chip regions 153 are formed are used; however, the number of chip regions 153 is not limited to six.

By detecting marks different from the alignment marks after the resin R is cured on the substrate W in this way, the relative misalignment of high-order components of each shot region can be measured and consequently a pattern can be formed by correcting this misalignment. The high-order misalignment (alignment error) such as distortion can be corrected and an amount of alignment error can be decreased at the time of imprinting.

Other Items

In the embodiments of the present invention, information regarding the relative misalignment determined by detecting the alignment marks after the completion of curing of the resin R or regarding the amount of change (amount of error Δ) representing the relative misalignment caused from when curing of the resin R is started to when curing of the resin R is completed is stored in the storage unit DB. The information stored in the storage unit DB is used when imprinting is performed on a shot region having imprinting conditions that are the same as or similar to those used for the measurement-target substrate W. The storage unit DB may be connected to a plurality of imprinting apparatuses. Information regarding the amount of relative misalignment after curing of the resin R that is determined by another imprinting apparatus may be used.

The amounts of errors Δ caused during the exposure step of a plurality of shot regions may be stored and the plurality of errors Δ may be statistically processed so as to determine an alignment correction value. Also, in the case where the amount of error Δ caused changes depending on the kind of the resin R used, information is accumulated such that the kind of the resin R and the amount of error Δ caused are associated with each other. The amount of resin R to be supplied onto the substrate W changes depending on the pattern formed on the mold M. In the case where the amount of error Δ caused changes depending on the kind of the mold M and the amount of resin R supplied, information is accumulated such that the kind of the mold M, the amount of resin R supplied, and the amount of error Δ caused are associated with one another.

Analysis is performed using accumulated pieces of information, such as exposure conditions and the kind of the substrate W set by the imprinting apparatus 100, layout information regarding the substrate W, the kind of resin R used, and thickness of a resin layer measured by a layer thickness measurement apparatus, in combination. An appropriate alignment operation target value is set from the analysis result for a shot region subjected to imprinting next. In this way, the relative misalignment after curing of the resin R can be reduced.

The alignment marks are detected for each shot region by the detectors AS. Thus, the relative positions of the mold M and the substrate W are determined for each shot region by the calculator CAL. Accordingly, the misalignment between the mold M and the substrate W after curing of the resin R is determined for each shot region. The determined misalignment is compared with a preset reference value (determination value). In this way, it can be determined whether or not a pattern transferred in the shot region is defective.

The imprinting apparatus according to the embodiments of the present invention can perform formation of patterns and overlay inspection, eliminating the necessity of transporting the substrate W having patterns formed thereon by the imprinting apparatus 100 to outside the imprinting apparatus 100 and of performing inspection by an overlay inspection apparatus. The relative misalignment can be measured for every shot region having a pattern formed therein after curing of the resin R has completed. Thus, it is possible to manage the relative misalignment after curing of the resin R on a shot-region-by-shot-region basis and to rapidly detect an abnormal shot region that is out of an allowable range.

It is also possible to identify a shot region or a chip subjected to detailed measurement on the basis of the measurement result of the relative misalignment after curing of the resin R and to perform measurement using an overlay inspection apparatus having a higher precision. That is, simplified inspection may be performed by the imprinting apparatus and detailed inspection may be performed by an overlay inspection apparatus on the basis of the result of the simplified inspection. Inspection is performed not for all shot regions but for a limited number of shot regions selected in advance, and thus, the time taken for an inspection apparatus to perform overlay inspection can be shortened.

If the relative misalignment between the mold M and the substrate W after curing of the resin R obtained by the imprinting apparatus 100 through inspection is within an allowable range, imprinting is performed on another shot region using the measurement result obtained by the alignment operation. On the other hand, if the relative misalignment between the mold M and the substrate W after curing of the resin R is out of the allowable range, the relative misalignment between the substrate W and a pattern formed on the resin R disposed on the substrate W is measured using an external overlay inspection apparatus of the imprinting apparatus 100. The external inspection apparatus is used to measure the precise relative misalignment after curing of the resin R. When patterns are formed on a substrate different from the substrate subjected to the measurement, alignment of the mold M and the substrate W can be performed using the measurement result obtained by the external inspection apparatus.

In either embodiment described above, photo-imprinting using ultraviolet light has been described. The illuminator IL described above functions as a curing unit configured to cure a resin. In the embodiments of the present invention, light of another wavelength range may be used. The kind of the resin R supplied onto the substrate W may be appropriately decided in accordance with the wavelength of irradiated light. Also, the embodiments of the present invention can be applied to thermal imprinting in which a resin is cured by heat as well as photo-imprinting. In this case, a heater (heat source) configured to supply heat to a resin is used instead of an illuminator serving as a curing unit.

Device Fabrication Method

A method for fabricating a device (such as a semiconductor integrated circuit device, liquid crystal display device, or micro-electro-mechanical system (MEMS)) includes a step of transferring (forming) a pattern on a substrate (such as a wafer, glass plate, or film substrate) by using the above-described imprinting apparatus. The fabrication method may include a step of etching the substrate having the pattern transferred thereon. In the case of fabricating another type of article such as a patterned medium (recording medium) or an optical element, the fabrication method may include a processing step of processing the substrate having the pattern transferred thereon instead of the etching step.

A semiconductor integrated circuit device is fabricated through pre-processing in which an integrated circuit is formed on a wafer and post-processing in which the integrated circuit chip formed on the wafer through the pre-processing is processed and completed as a product. The pre-processing includes a step of transferring a pattern on a mold to a resin on a substrate by using the above-described imprinting method or imprinting apparatus. The post-processing includes an assembling step (dicing or bonding) and a packaging step (sealing). A liquid crystal display device is fabricated through a step of forming a transparent electrode. The step of forming a transparent electrode includes a step of applying a resin onto a glass substrate on which a transparent conductive film is vapor-deposited, and a step of transferring a pattern on a mold to the glass substrate having the resin applied thereon using the above-described imprinting method or imprinting apparatus. The device fabrication method according to the embodiment enables devices of a higher quality to be fabricated at a lower cost than that of devices of the related art.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-104298 filed May 16, 2013 and Japanese Patent Application No. 2014-085929 filed Apr. 17, 2014 which are hereby incorporated by reference herein in their entirety.

What is claimed is:

1. An imprinting apparatus to imprint a pattern onto a resin using a mold, the imprinting apparatus comprising:
   a detector configured to make a detection by detecting a mold mark provided on the mold and a substrate mark provided on a substrate;
   a driving unit configured to change a relative position between the mold and the substrate;
   a curing unit configured to cure an uncured resin residing in a shot region on the substrate; and
   a controller configured to perform control to cause the detector to make a detection,
   wherein the controller performs control to cause the detector to make a first detection by detecting the mold mark and the substrate mark provided on a first shot region on a substrate,
   wherein the controller performs control to cause the driving unit to change a first relative position to a second relative position between the mold and the substrate based on the first detection for aligning the mold and the first shot region,
   wherein, after the change from the first relative position to the second relative position is completed, the controller performs control to cause the curing unit to cure uncured resin residing in the first shot region and in contact with the mold, wherein the curing results in a third relative position between the mold and the substrate after the uncured resin has been cured,
   wherein the controller causes the detector to make a second detection in state of the third relative position, and
   wherein, before the uncured resin residing in a second shot region on the substrate cures, the controller causes the driving unit to offset the relative position based on the second detection for aligning the mold and the second shot region.

2. The imprinting apparatus according to claim 1,
   wherein the substrate includes a plurality of shot regions arranged on the substrate, each of the plurality of shot regions includes a pattern having the substrate mark formed in the pattern, and the plurality of shot regions include a first shot region and a second shot region subjected to imprinting after the first shot region, and
   wherein, in a case where the controller controls operations to sequentially perform imprinting on the plurality of shot regions by performing alignment, curing the uncured resin, and then determining the amount of relative misalignment for each of the plurality of shot regions, the controller is configured to perform pre-curing alignment for the second shot region by using (i) the post-curing amount of relative misalignment determined for the first shot region and (ii) a pre-curing result of the detector detecting the mold mark and the substrate mark for the second shot region.

3. The imprinting apparatus according to claim 1,
   wherein the substrate is a plurality of substrates having a first substrate and a second substrate subjected to imprinting after the first substrate, and
   wherein, in a case where the controller controls operations to sequentially perform imprinting on the plurality of substrates by performing alignment, curing the uncured resin, and then determining the amount of relative misalignment for each of the plurality of substrates, the controller is configured to perform pre-curing alignment for the second substrate by using (i) the post-curing amount of relative misalignment determined for the first substrate and (ii) a pre-curing result of the detector detecting the mold mark and the substrate mark for the second substrate.

4. The imprinting apparatus according to claim 1, wherein the controller further is configured to determine whether the imprinted pattern is defective by comparing the determined amount of relative misalignment with a preset reference value.

5. The imprinting apparatus according to claim 1,
   wherein the substrate includes a plurality of shot regions arranged on the substrate, and each of the plurality of shot regions includes a pattern having the substrate mark formed in the pattern, and
   wherein, in a case where (i) the controller controls operations to sequentially perform imprinting on the plurality of shot regions by performing alignment, curing the uncured resin, and then determining the amount of relative misalignment for each of the plurality of shot regions, and (ii) it is determined that an amount of relative misalignment determined for a target shot region is not within an allowable range, the controller is configured to stop performing imprinting on shot regions subsequent to the target shot region.

6. The imprinting apparatus according to claim 1, wherein the substrate includes a plurality of shot regions arranged on the substrate, each of the plurality of shot regions includes a pattern having the substrate mark formed in the pattern, and the plurality of shot regions include a first shot region and a second shot region subjected to imprinting after the first shot region, the imprinting apparatus further comprising a supplier configured to supply the uncured resin to each of the plurality of shot regions
   wherein, in a case where the controller controls operations to sequentially perform imprinting on the plurality of shot regions by performing alignment, curing the uncured resin, and then determining the amount of relative misalignment for each of the plurality of shot regions, the controller is configured to correct an amount of uncured resin to be supplied to the second shot region by using the amount of relative misalignment determined for the first shot region.

7. The imprinting apparatus according to claim 1,
   wherein the substrate includes a plurality of shot regions arranged on the substrate, each of the plurality of shot regions includes a pattern having the substrate mark formed in the pattern, the plurality of shot regions include a first shot region and a second shot region subjected to imprinting after the first shot region, and the curing unit includes an illuminator configured to radiate light used to cure the uncured resin, and wherein, in a case where the controller controls operations to sequentially perform imprinting on the plurality of shot regions by performing alignment, curing the uncured resin, and then determining the amount of relative misalignment for each of the plurality of shot regions, the controller is configured to correct an amount of light to be radiated by the illuminator to the second shot region by using the amount of relative misalignment determined for the first shot region.

8. The imprinting apparatus according to claim 1, wherein the mold mark and the substrate mark detected by the detector to perform alignment are, respectively, different from the mold mark and the substrate mark detected by the detector after the resin has been cured.

9. The imprinting apparatus according to claim 8, wherein, after performing alignment, the controller is configured to cause the detector to move in a state where the mold is in contact with the uncured resin and then cause the detector to detect the mold mark and the substrate mark.

10. The imprinting apparatus according to claim 1, wherein, after the resin has been cured, the controller is configured to cause the detector to detect the mold mark and the substrate mark at two or more positions.

11. The imprinting apparatus according to claim 1, wherein, after the uncured resin has been cured, the controller causes the detector to make the second detection before the substrate is removed from the imprinting apparatus.

* * * * *